(12) United States Patent
Ravi et al.

(10) Patent No.: US 8,809,097 B1
(45) Date of Patent: Aug. 19, 2014

(54) PASSIVATED EMITTER REAR LOCALLY PATTERNED EPITAXIAL SOLAR CELL

(75) Inventors: Kramadhati V. Ravi, Atherton, CA (US); Tirunelveli S. Ravi, San Jose, CA (US)

(73) Assignee: Crystal Solar Incorporated, Santa Clara, CA (US)

( * ) Notice: Subject to any disclaimer, the term of this patent is extended or adjusted under 35 U.S.C. 154(b) by 0 days.

(21) Appl. No.: 13/241,112

(22) Filed: Sep. 22, 2011

Related U.S. Application Data

(60) Provisional application No. 61/403,962, filed on Sep. 22, 2010.

(51) Int. Cl.
*H01L 21/00* (2006.01)

(52) U.S. Cl.
USPC ........... 438/57; 438/48; 438/98; 257/E21.001

(58) Field of Classification Search
USPC .......................................................... 438/98
See application file for complete search history.

(56) References Cited

U.S. PATENT DOCUMENTS

| | | | |
|---|---|---|---|
| 5,811,348 A * | 9/1998 | Matsushita et al. | 438/455 |
| 2004/0200520 A1 * | 10/2004 | Mulligan et al. | 136/256 |
| 2009/0007962 A1 * | 1/2009 | Wenham et al. | 136/256 |
| 2009/0188553 A1 * | 7/2009 | Dubin | 136/256 |
| 2009/0227063 A1 | 9/2009 | Ravi et al. | |
| 2010/0015756 A1 * | 1/2010 | Weidman et al. | 438/96 |
| 2010/0029039 A1 * | 2/2010 | Shan et al. | 438/98 |
| 2010/0108130 A1 | 5/2010 | Ravi | |
| 2010/0108134 A1 | 5/2010 | Ravi | |
| 2011/0041911 A1 * | 2/2011 | Lee et al. | 136/256 |
| 2011/0056532 A1 | 3/2011 | Ravi et al. | |
| 2011/0073176 A1 * | 3/2011 | Kim | 136/256 |
| 2012/0040487 A1 | 2/2012 | Asthana et al. | |
| 2012/0048376 A1 * | 3/2012 | Gilman | 136/261 |

* cited by examiner

*Primary Examiner* — Angel Roman
(74) *Attorney, Agent, or Firm* — David H. Jaffer; Pillsbury Winthrop Shaw Pittman LLP

(57) ABSTRACT

Passivated emitter rear local epitaxy (PERL-e) thin Si solar cells may be formed with a heavily doped epitaxial back surface field (BSF) layer, which is patterned to form well spaced point contacts to the silicon base on the rear of the solar cell. The back side of the cell may be finished with a dielectric passivation layer and a metallization layer for making electrical contact to the cell. PERL-e thick Si solar cells may be formed with heavily doped epitaxial films as the back point contacts, where the point contacts are defined by the provision of a selectively patterned thermal oxide on the rear wafer surface. Furthermore, absorption of longer wavelength, infrared (IR), light in thin silicon solar cells may be improved by the addition of a dielectric stack on the rear surface of the solar cell (a back reflector).

18 Claims, 15 Drawing Sheets

PASSIVATED EMITTER REAR LOCALLY PATTERNED EPITAXIAL SOLAR CELL

This application claims the benefit of U.S. Provisional Application Ser. No. 61/403,962 filed Sep. 22, 2010, incorporated by reference in its entirety herein.

FIELD OF THE INVENTION

The present invention relates generally to solar cells, and more particularly to solar cells with high efficiency.

BACKGROUND

The highest efficiency (24.7%) crystalline silicon solar cell produced to date is the PERL (Passivated Emitter Rear Locally diffused) cell first developed by Martin Green et al. See IEEE Transactions on Electron Devices Vol. 46, No. 10, October 1999. However, these cells are costly to fabricate since expensive float zone silicon was utilized for the device fabrication and the use of photolithography for metal contact formation is not conducive to low manufacturing cost. There is a need for lower cost solar cells with comparable efficiency to the PERL cell, and improved methods of fabricating these cells that does not involve the high temperature diffusion of boron for the formation of back contacts.

As silicon wafer thickness is reduced to reduce silicon consumption and hence manufacturing costs of photovoltaic products, more of the long wavelength infrared radiation will pass through the thin wafer without being absorbed, due to the relatively poor absorption coefficient of silicon. Consequently cell efficiency is reduced for thin (less than roughly 50 microns) silicon cells. There is a need for solar cell structures which can compensate for the poor absorption of longer wavelength light.

SUMMARY OF THE INVENTION

Some embodiments of the present invention are PERL-e (Passivated Emitter Rear Local epitaxy) solar cells, which are fabricated with epitaxial deposition processes. The PERL-e solar cells may have some or all of the following advantages. First, a majority of the back side of the PERL-e cell is not heavily doped, unlike either Al fired $p^+$ back surface, boron diffused $p^+$ region or epitaxially grown $p^+$ region solar cells. This significantly reduces free carrier absorption of light in the $p^+$ region as well as reducing minority carrier lifetime in this region due to heavy doping. Second, a high quality lightly doped back surface can be passivated with various dielectric films (such as silicon dioxide, silicon nitride and amorphous silicon) to minimize the back surface recombination velocity. Third, with an epitaxially produced back surface field (BSF) followed by selective etch back of this region, the process of creating heavily boron doped regions can be lower in cost as compared to boron diffusion and better in quality as compared to boron diffused regions or to the use of laser fired contacts. Furthermore, the use of epitaxial back surface fields provides greater freedom in terms of junction depth ($p^+$ layer thickness), junction profiles and dopant concentrations. PERL-e solar cells may be fabricated with either thin or thick silicon.

According to embodiments of the present invention, PERL-e thin Si solar cells may be formed with a heavily doped epitaxial BSF layer, which is patterned to form well spaced point contacts to the silicon base on the rear of the solar cell. The back side of the PERL-e cell may be finished with a dielectric passivation layer and a metallization layer for making electrical contact to the cell. Other embodiments of the present invention are PERL-e thick Si solar cells, which utilize heavily doped epitaxial films as the back point contacts, where the local heavily doped (e.g. $p^+$) regions are defined by the provision of a selectively patterned thermal oxide on the rear wafer surface. The thermal oxide may be patterned by lithography and etching, the use of screen printed etch resists or by local laser ablation of the oxide.

According to further embodiments of the present invention, absorption of longer wavelength, infrared (IR), light in thin silicon solar cells is improved by the addition of a dielectric stack on the rear surface of the solar cell (a back reflector), said stack acting to reflect the longer wavelength light back through the active layers of the solar cell. A back reflector comprises a dielectric stack, including a dielectric film with a low refractive index as compared to silicon, and a conducting and reflecting metal layer on top of the dielectric. The dielectric stack may comprise one or a multiplicity of dielectric layers. Local point contacts are made between the metal (typically aluminum) and the rear surface of the silicon. Aspects of the present invention relate to the choice of materials, the method for material deposition and the fabrication sequence for providing IR reflective dielectric stacks on thin silicon solar cells.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting;

rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
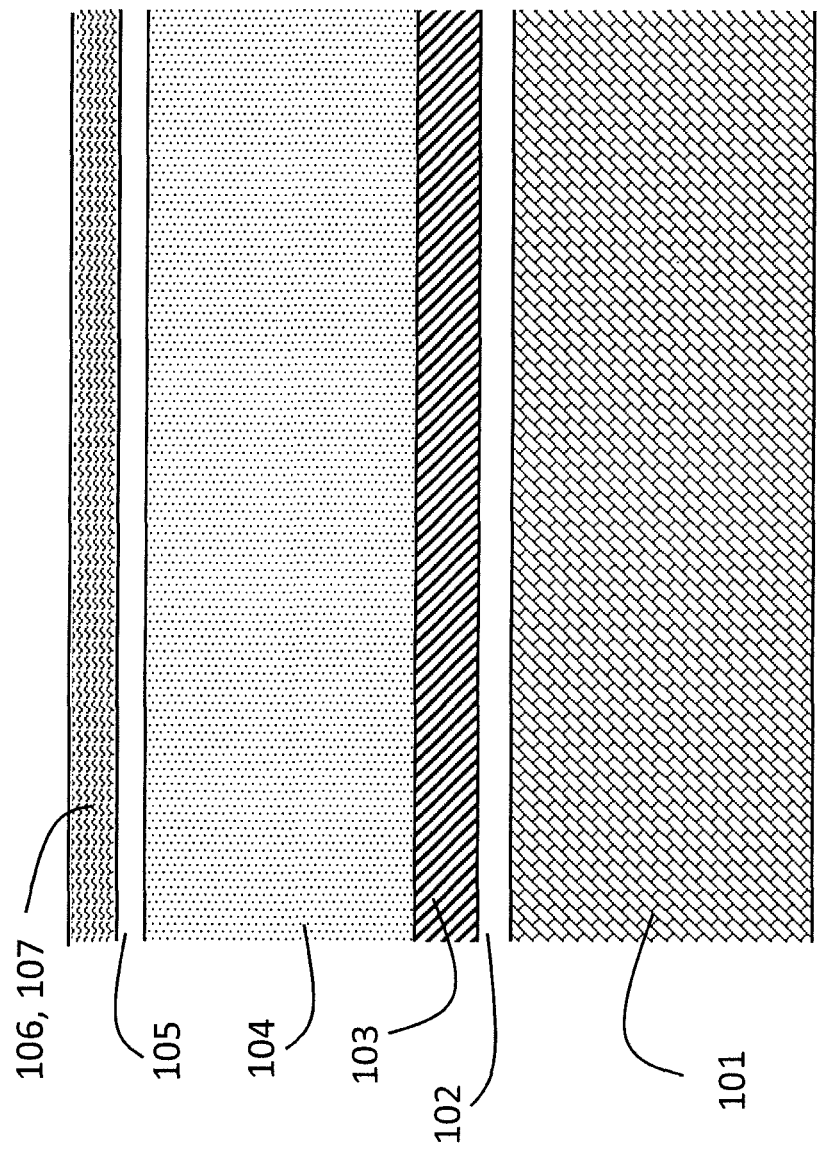
FIGS. 1-3 illustrate the fabrication of solar cells on a silicon substrate, according to some embodiments of the present invention.
Figure 2:
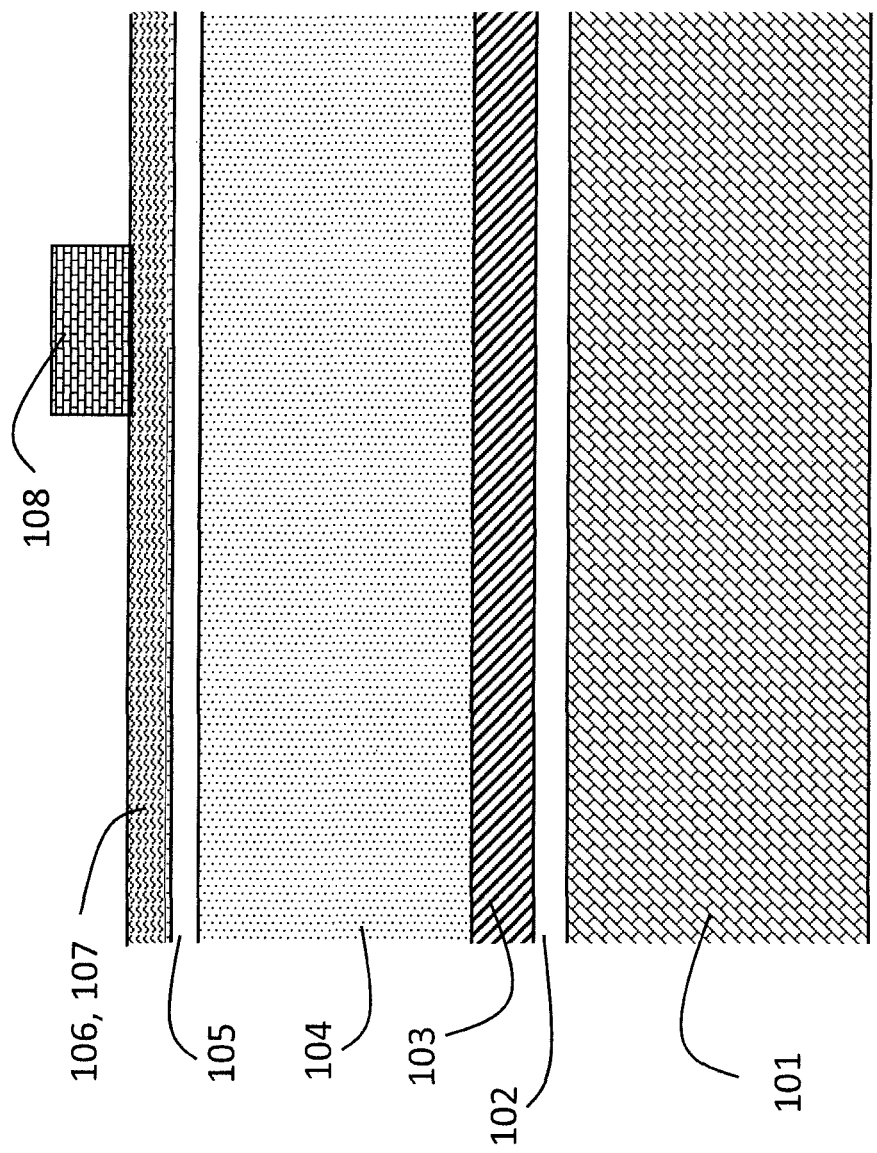
Figure 3:
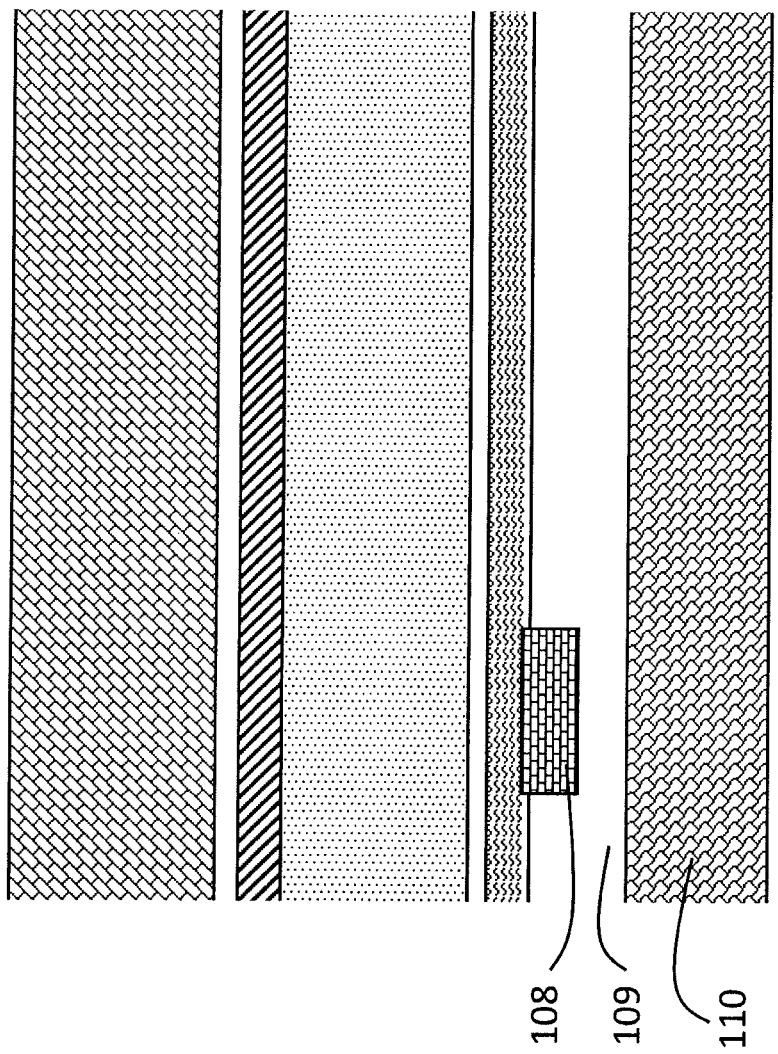

FIGS. 1-3 show cross-sectional representations of one example of a method that may be used to form the starting structure for a process for forming PERL-e solar cells according to the present invention, as illustrated in FIGS. 4-7.

FIGS. 1-3 show cross-sectional views of a silicon wafer with a porous silicon separation layer and epitaxial layers grown over the porous silicon separation layer. Further details of fabrication methods for the separation layer and epitaxial layers are provided in published U.S. patent applications nos. 2010/0108134 to K. V. Ravi, 2010/0108130 to K. V. Ravi, 2009/0227063 to T. S. Ravi et al., and 2011/0056532 to T. S. Ravi et al. and U.S. patent application Ser. No. 13/208,302 to A. Asthana et al., all incorporated by reference in their entirety herein. In brief, a process flow to form the structure of FIG. 1 may include the following steps: (1) anodic etch one side of a silicon wafer 101 to form a porous silicon layer 102, roughly 1 to 2 microns thick; (2) grow 30 to 50 microns of epitaxial silicon on top of the porous silicon layer—the epitaxial film is a heavily doped (approx. 1E19 to 1E20 atoms/cc) $p^+$ boron rich layer 103 on top of which is a lightly doped (approx. 1E16) p-type absorber layer 104; (3) the epitaxial layer is texture etched by well known processes, using solutions containing potassium hydroxide (KOH) and isopropyl alcohol (IPA)—note that the texture of the surface is not shown in FIGS. 1-3, but is shown in exaggerated form in subsequent figures—for example, FIG. 4; (4) an $n^+$ p junction is formed near the top surface of the absorber layer by diffusing phosphorus into the silicon using well known techniques, creating an $n^+$ emitter 105; (5) the phosphor silicate glass formed during diffusion is removed by chemical etching; (6) a thin (approx. 10 nm) film of oxide is grown on the phosphorus diffused surface—this oxide film 106 acts to passivate the silicon surface; and (7) a 70 to 90 nm thick silicon nitride layer 107 is deposited on the oxide surface by plasma-enhanced chemical vapor deposition (PECVD) or by reactive sputtering—the silicon nitride layer acts as an anti-reflection coating (ARC) and preferably has a refractive index close to 2 to give good anti-reflection performance.

FIG. 2 shows metallization of the front surface to form busbars 108 using well known processes such as silver screen printing and firing. Commercial Ag-pastes that usually have the capability to "fire through" nitride and oxide during the firing cycle may be used. Hence, during the firing of the screen printed silver, the Ag fires through the nitride 107 and oxide 106 and forms an ohmic contact with the emitter surface. Alternatively, electroplating of Ni and Cu preceded by a dielectric patterning process, or metal evaporation techniques may be used to form the busbars 108. Cell interconnect ribbons (not shown in the figures) are attached to the bus bars 108 on the cell. The solar cell is then bonded to glass 110 using encapsulants 109 such as ethylene vinyl acetate EVA or silicones, as shown in FIG. 3. The silicon substrate 101 is then edge released and the solar cell is exfoliated, using techniques described in published U.S. patent applications nos. 2010/0108134 to K. V. Ravi, 2010/0108130 to K. V. Ravi, 2009/0227063 to T. S. Ravi et al., and 2011/0056532 to T. S. Ravi et al., all incorporated by reference in their entirety herein. Lastly, the back side is etched to remove any remnants of the porous silicon 102—this provides the structure shown in FIG. 4.

FIGS. 4-7 illustrate process steps for the fabrication of a PERL-e solar cell structure, according to some embodiments of the present invention. The starting structure shown in FIG. 4 may be fabricated above, as described with reference to FIGS. 1-3; alternatively, other processes may be used. Several methods of material deposition may be used for the embodiment shown in FIGS. 4-7, with the proviso that the methods are low temperature methods since the thin solar cell is bonded to glass using an adhesive or encapsulation material such as EVA (ethylene vinyl acetate) or silicones of various types. These materials cannot be heated to temperatures in excess of approx. 100° C. (for EVA) and approx. 250° C. (for silicones) in the course of depositing materials on the back surface of the solar cells.

Figure 4:
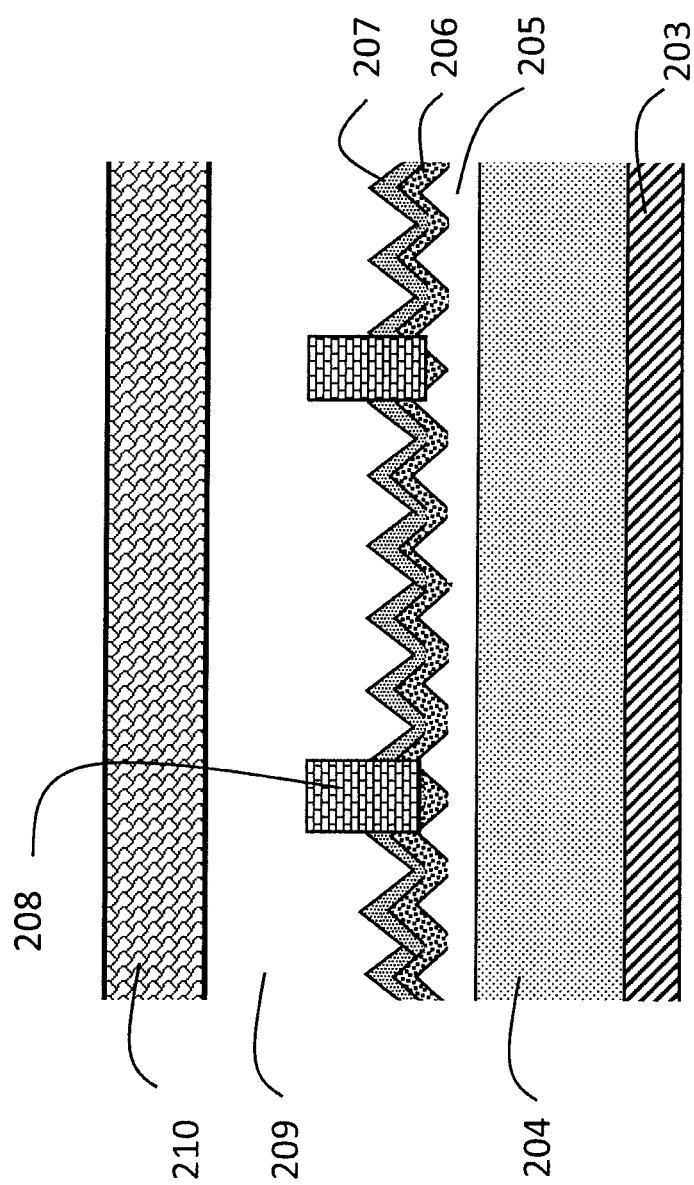
FIGS. 4-7 illustrate the fabrication process of a thin silicon PERL-e solar cell, according to some embodiments of the present invention.
Figure 5:
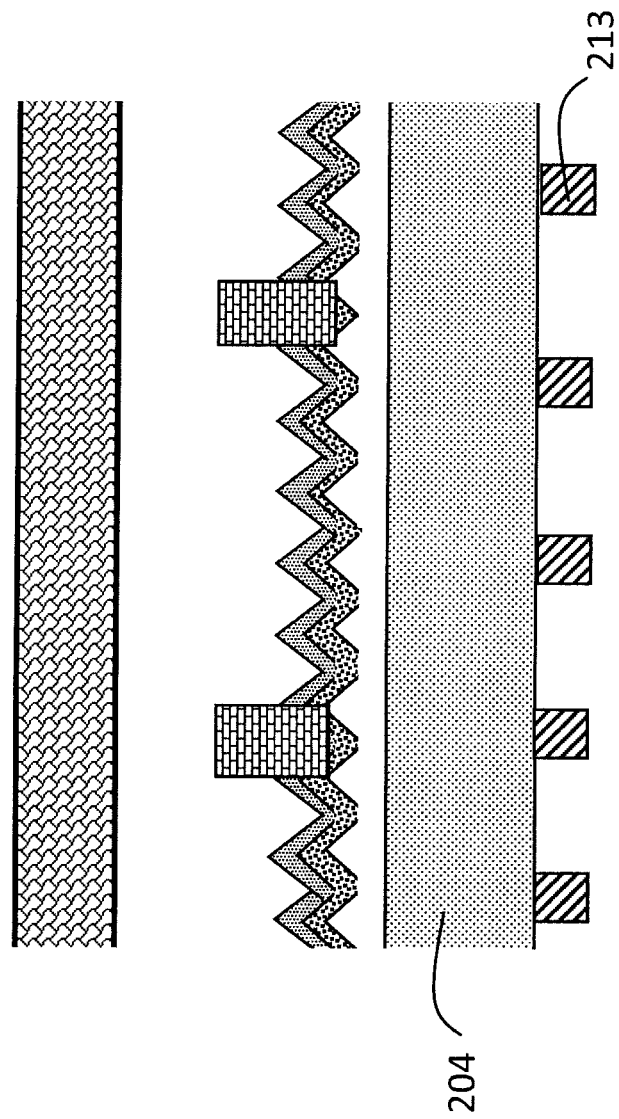
Figure 6:
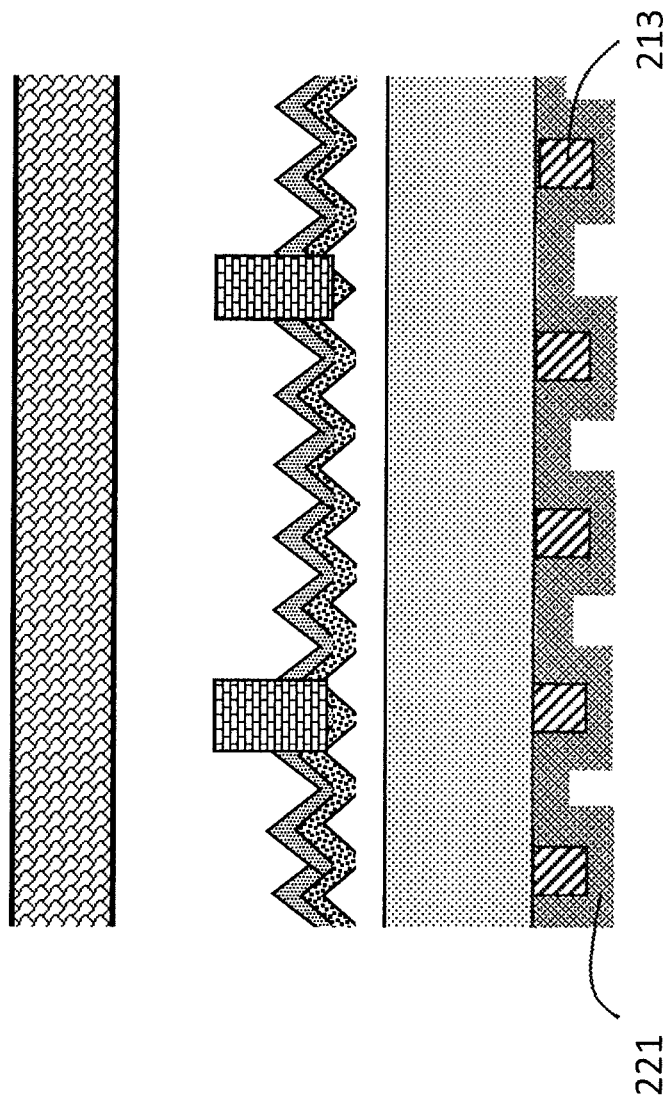
Figure 7:
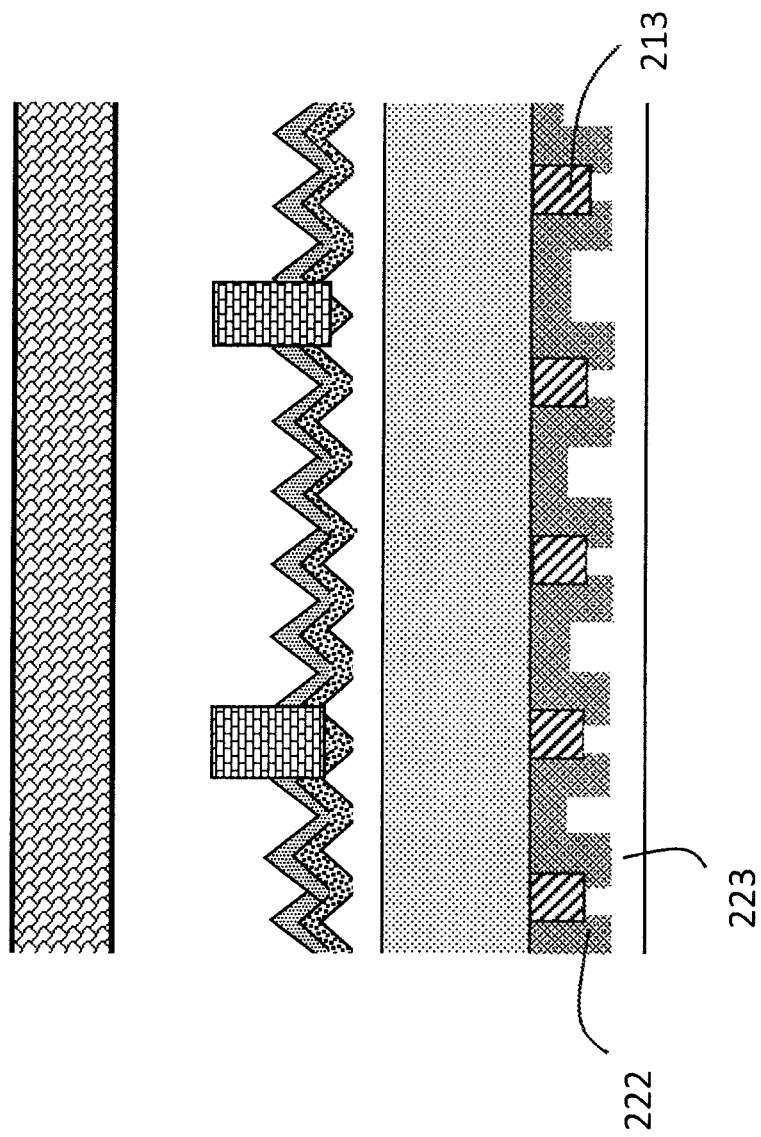

FIG. 4 shows a thin epitaxial device, with front side processed, bonded to EVA 209 and glass 210; on the rear side there is a $p^+$ epitaxial back surface field layer (BSF) 203. Note that the textured front side surface is exaggerated and the metal front side contacts 208 to the emitter 205 are shown only schematically—the contacts 208 are shown overlapping the passivation layer 206 and ARC 207 to indicate an ohmic contact has been formed to the emitter 205. FIG. 5 shows the boron rich BSF layer selectively etched back to create local heavily doped point contacts 213. (The portions of the back surface of the base 204 which are covered by the point contacts 213 are referred to herein as contact areas.) Etch back may be achieved by screen printing etch resist materials in the form of small (e.g. 100 micron diameter) regions that are prevented from etching by the etch resist material followed by etch back of the rest of the $p^+$ epitaxial layer in a suitable silicon etch (such as KOH or $HNO_3+HF$). The point contacts 213 are approximately 100 micron wide dots (mesas) separated roughly 1 mm apart. The point contacts are generally formed in an evenly spaced array over the back surface of the base. The dimensions of the dots and the separation of the dots may be varied. In determining the size and spacing of dots the reduction of the extent of the heavily doped silicon on the back side of the cell is balanced with avoiding large resistive losses in the device; the yield and cost of the processing required to form the dots is also a consideration. For example, the diameter of the dots may be varied by a factor of up to 2 to 5 smaller than 100 microns and the separation of dots may be varied by a factor of 2 larger or smaller than 1 mm. Note that the thickness of the BSF, and hence of the point contacts, can vary over a wide range (e.g. 1 micron to 10 microns). FIG. 6 shows the rear surface with point contacts and a dielectric layer 221 for passivation of the rear surface of the base 204. The dielectric layer 221 may be chosen from silicon dioxide, silicon nitride, amorphous silicon and aluminum oxide, for example. Methods that can be used for dielectric deposition include: (1) physical vapor deposition including sputtering and e-beam evaporation; (2) low temperature chemical vapor deposition (CVD) including plasma enhanced CVD; (3) hot wire CVD which is particularly suited for the deposition of silicon nitride films and amorphous silicon films; and (4) spin on techniques whereby the dielectric material is made into a liquid which can be spun on or sprayed on to the silicon. Other techniques such as atomic layer deposition and ion beam deposition are also possible candidates. The dielectric has to be thin (approx. 70 to 90 nm) and conformal with the point contacts, as shown in FIG. 6. FIG. 7 shows the dielectric 221 removed off the surface of the point contacts 213, so that the Al alloy metallization 223 will make electrical contact. Dielectric removal from the point contacts 213 may be achieved through lithography and etching or by local laser ablation, forming patterned dielectric 222. The Al alloy metallization 223 may be Al alloyed with Ni, V; other metals that can be used for metallization 223 include Ti—Pd—Ag, Ni and electroplated copper.

Commonly, prior art thick Si solar cell fabrication processes include metallization of the rear surface by screen printing aluminum and firing the metal into the silicon to form a $p^+$ p junction. An issue with this approach is that the back $p^+$ p junction and the aluminum-silicon interface is of poor electrical quality, precluding the achievement of high conversion efficiency in the solar cell. There is a need for improved solar cell structures and fabrication processes. Thick silicon PERL-e solar cell designs may provide the desired high performance with a relatively efficient fabrication process.

Figure 8:
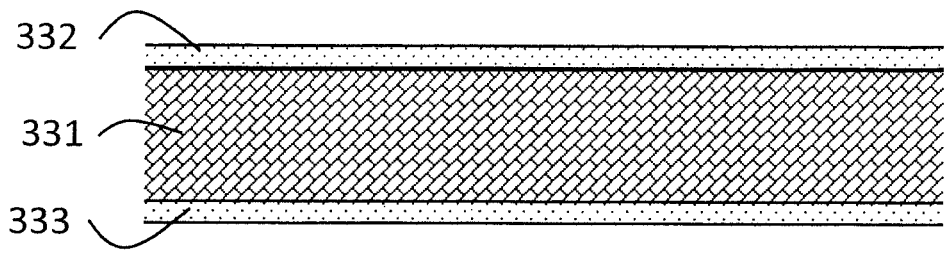
FIGS. 8-13 illustrate the fabrication process of a thick silicon PERL-e solar cell, according to some embodiments of the present invention.
Figure 9:
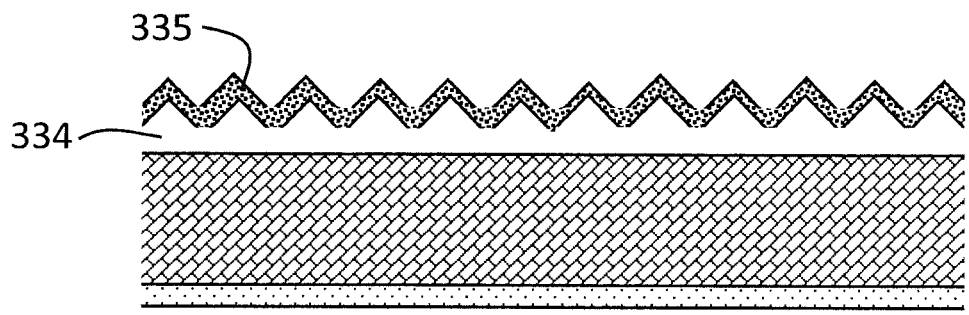
Figure 10:
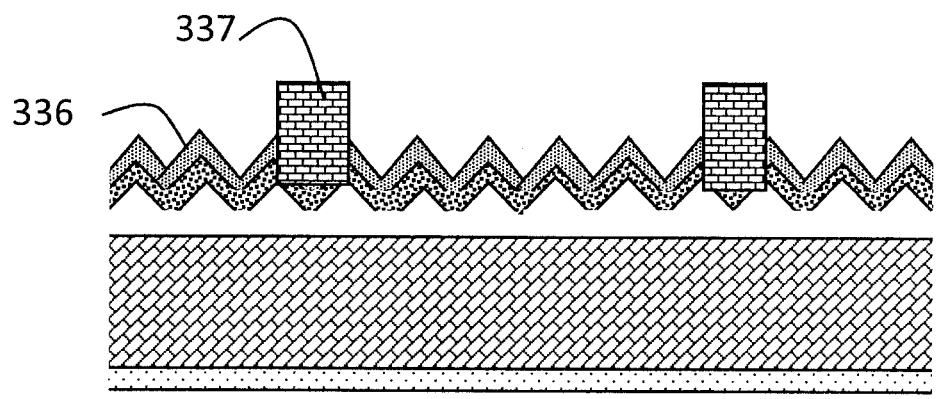
Figure 11:
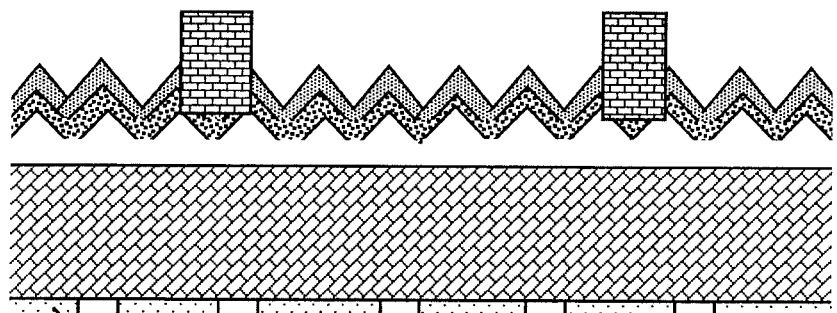
Figure 12:
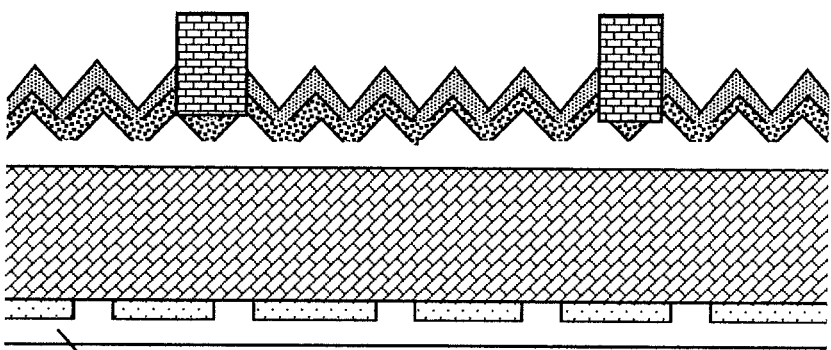
Figure 13:
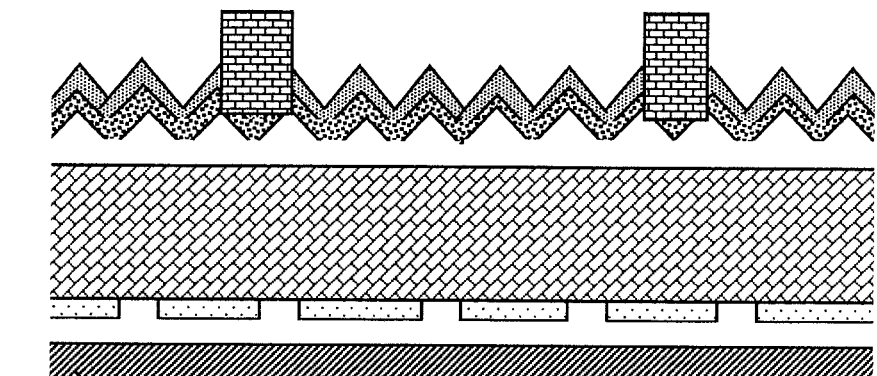

FIGS. 8-13 illustrate a process flow for the fabrication of PERL-e cells on thick wafers according to some embodiments of the present invention. FIG. 8 shows a thick silicon wafer 331, approximately 180 microns thick, for example, with a thermal oxide 332, 333 grown on the two surfaces of the wafer, respectively. The oxide thickness is approximately 10 nm. (Other embodiments may include depositing an oxide or other suitable passivating dielectric instead of growing a thermal oxide.) The front side of the wafer 331 is patterned and then texture etched, using a crystallographically selective etch to produce the textured surface shown in FIG. 9, followed by formation of an emitter 334 and a passivation layer 335. The process for emitter 334 and passivation layer 335 formation is as described for the structure in FIG. 3. In FIG. 10 an anti-reflection coating 336 of silicon nitride is deposited over the passivation layer 335 and front side metal contacts 337 are formed using techniques such as those described with reference to FIGS. 1-3, for example. FIG. 11 shows patterning of the oxide 333 to expose contact areas of the rear surface of the silicon wafer 331. The thermal oxide 333 may be patterned by lithography and etching, the use of screen printed etch resists or by local laser ablation of the oxide, for example, forming a patterned oxide 343. Note that 100 micron openings 1 mm apart will result in good epitaxy in the openings and also significantly reduce free carrier absorption compared to a continuous planar heavily doped back contact. FIG. 12 shows a $p^+$ epitaxial film 338 grown on the back surface. Growth of the film 338 starts in the contact areas of silicon wafer 331 and grows to cover the oxide 343 and thus form a continuous film. Note that the epitaxial silicon should be single crystal within the 100 micron openings in the oxide (assuming a single crystal silicon wafer), but may be polycrystalline over the oxide between the openings. FIG. 13 shows a metal film 339 deposited over the epitaxial $p^+$ film 338 to form a back electrical contact. The metal may be an Al alloy, a Ag—Al alloy, Ti—Pd—Ag or Ni/Cu, for example.

The process flows illustrated in FIGS. 4-7 and 8-13 are merely examples of many process flows that could be used to fabricate PERL-e solar cell structures with thin and thick Si. There are many variations on these process flows that are within the teaching and concepts of the present invention. For example, the rear dielectric film can be deposited through a shadow mask so the dielectric does not deposit on the $p^+$ islands; a two layer stack may be used, comprising an amorphous silicon film for surface passivation followed by a sputter deposited or e-beam evaporated silica film for the rear reflector stack.

Furthermore, the PERL-e thick silicon process is applicable to both single crystal and multicrystalline silicon substrates.

FIGS. 14-17 illustrate a process flow for the fabrication of solar cells with a dielectric stack for improvement of long wavelength absorption—in this particular example a flow is shown for the fabrication of a solar cell structure with a passivated emitter and a dielectric stack at the rear surface. Several methods of material deposition may be used for the embodiment shown in FIGS. 14-17, with the proviso that the methods are low temperature methods since the thin solar cell is bonded to glass using an adhesive or encapsulation material such as EVA (ethylene vinyl acetate) or silicones of various types. These materials cannot be heated to temperatures in excess of approx. 100° C. (for EVA) and approx. 250° C. (for silicones) in the course of depositing materials on the back surface of the solar cells.

Figure 14:
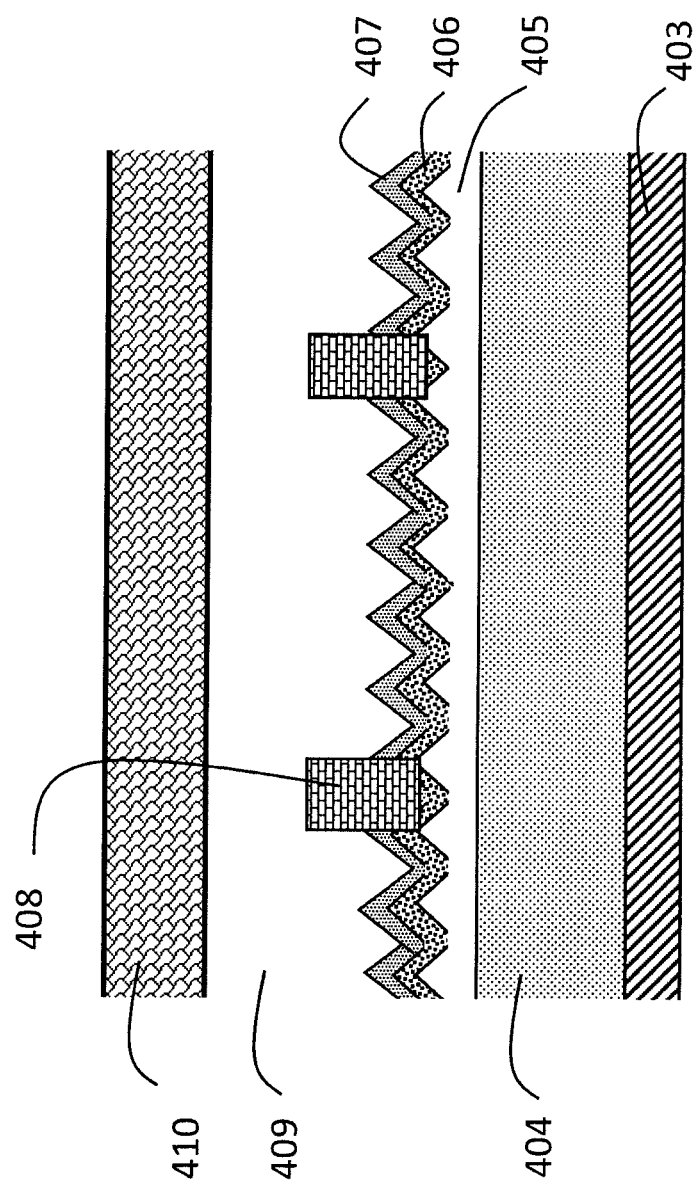
FIGS. 14-18 illustrate the fabrication process of a dielectric stack on a thin silicon solar cell for improved long wavelength performance, according to some embodiments of the invention.

FIG. 14 shows a thin (approx. 50 microns or less) solar cell with front side processing completed (formation of emitter 405, passivation layer 406, ARC 407 and contacts 408) and the cell bonded to glass 410 with an encapsulant 409. The front side processing may be as described above in reference to FIGS. 1-3, for example.

Figure 15:
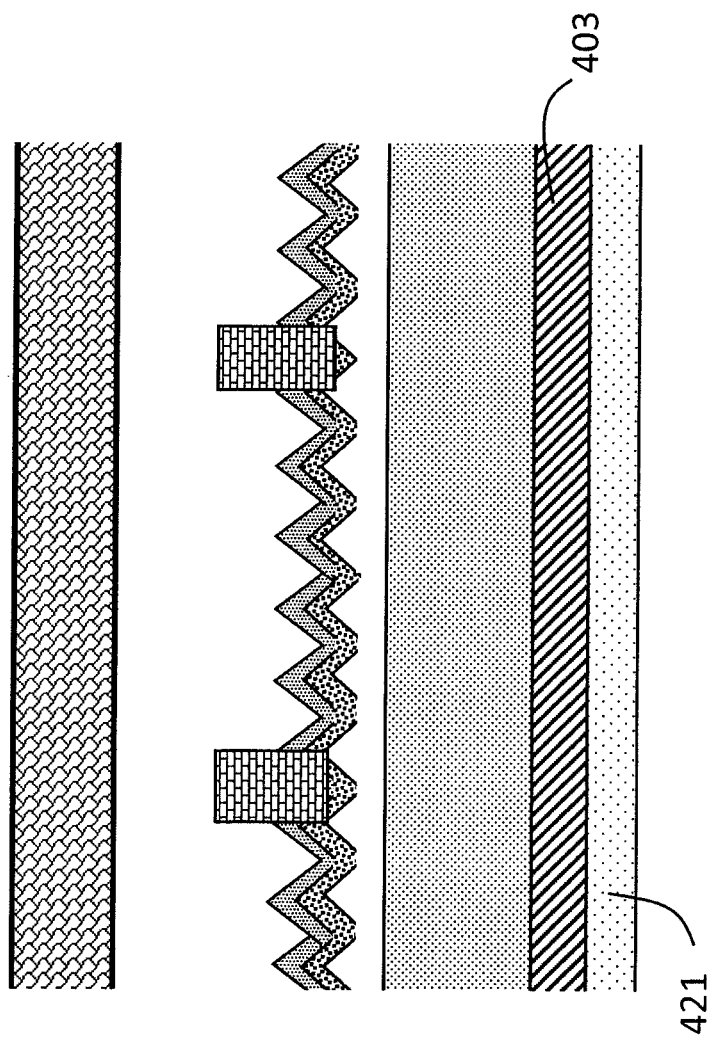

FIG. 15 shows deposition of a dielectric layer 421, such as e-beam evaporated silica (thickness approx. 100 nm), on the BSF layer 403. Other candidates for the dielectric material are provided in Table 1, below. Methods that can be used for dielectric deposition include: (1) physical vapor deposition including sputtering and e-beam evaporation; (2) low temperature chemical vapor deposition (CVD) including plasma enhanced CVD; (3) hot wire CVD which is particularly well suited for the deposition of silicon nitride films and amorphous silicon films; and (4) spin on techniques whereby the dielectric material is made into a liquid which can be spun on or sprayed on to the silicon. Other techniques such as atomic layer deposition and ion beam deposition are also possible candidates.

Figure 16:
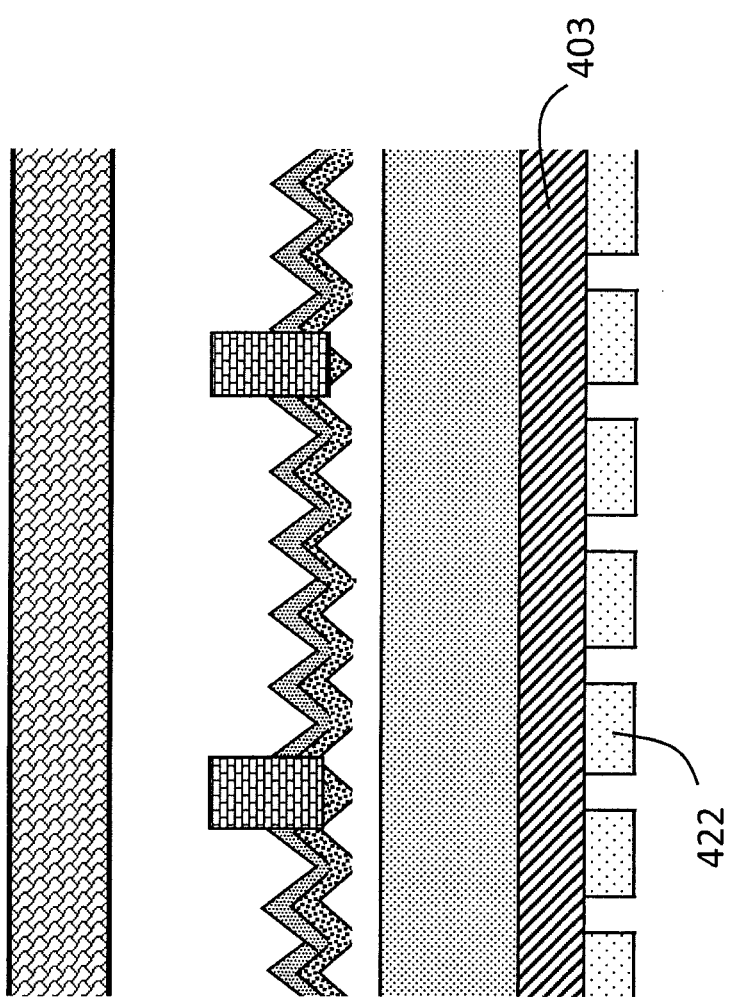

FIG. 16 shows patterning of holes in the dielectric 421, forming a patterned dielectric film 422. Suitable patterning methods include: (1) lithography and etching; (2) screen printing etching pastes; and (3) laser ablation. The holes are typically 100 microns in diameter and are spaced roughly 1 mm apart.

Figure 17:
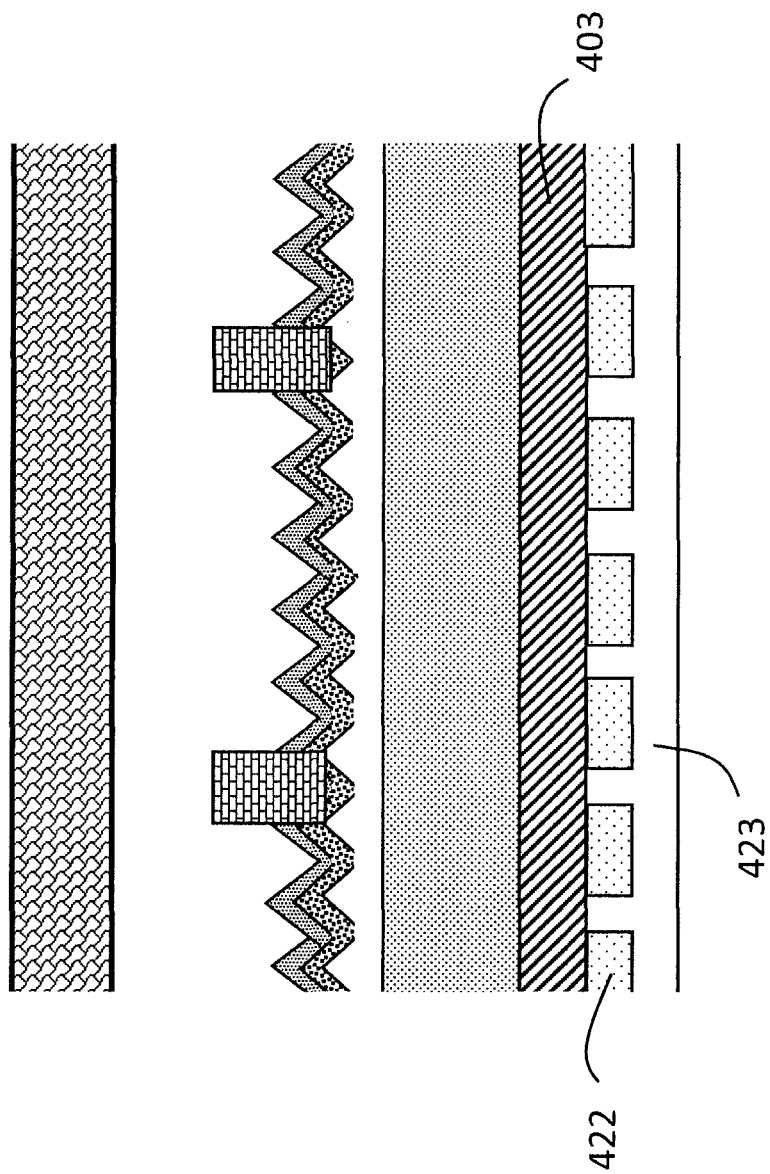

In FIG. 17 a blanket layer 423 of Al (Ni, V) alloy is sputtered over the patterned dielectric 422 so as to form electrical point contacts to the exposed areas of the BSF 403. The metal film 423 may also be evaporated. Following deposition of the metal film 423, a low temperature (less than 250° C.) anneal is performed, so as to form an ohmic contact between the metal and the BSF 403.

Table 1 provides a list of some dielectric materials that may be used as a dielectric layer in the dielectric stack on the back side of the solar cell structure. For reference it is noted that the refractive indices (RI) of air and silicon are 1 and 3.5, respectively.

TABLE 1

Candidate dielectric materials for back side dielectric stack.

| Material | RI | Comments |
|---|---|---|
| $SiO_2$ | 1.54 | Low temperature deposition by sputtering or by e-beam evaporation may be used. |
| $Si_3N_4$ | 1.99 | Low temperature deposition by PECVD or hot wire CVD may be used. |
| Amorphous Si | approx. 4 | RI values can be below 2, for example with increased hydrogen content of the films. Low temperature deposition by HWCVD may be used. |
| $Al_2O_3$ | 1.76 | Low temperature deposition by atomic layer deposition (ALD) may be used. |
| SiC | 2.6 | Low temperature deposition by PECVD or ALD may be used. |
| AlN | 2.13 | Low temperature deposition by reactive sputtering |

TABLE 1-continued

Candidate dielectric materials for back side dielectric stack.

| Material | RI | Comments |
|---|---|---|
| | 1.8-1.9 | may be used. |
| AlON | 1.78 | Low temperature deposition by sputtering techniques may be used. |

The dielectric stack is already integrated into the PERL-e solar cells, as will be apparent to those skilled in the art after reading the description of the present invention. Compare FIG. 7 with FIG. 17. Note that since the device structure of FIG. 17 has a $p^+$ p junction between the BSF 403 and base 404, passivation of the back surface of the device is not critical and the patterned dielectric layer 422 functions primarily as a reflector for improved long wavelength absorption. However, in the PERL-e device structures, such as shown in FIG. 7, the patterned dielectric 222 is required for passivation of the back surface of the base 204, although this passivation layer also functions as a reflector for improved long wavelength absorption.

Figure 18:
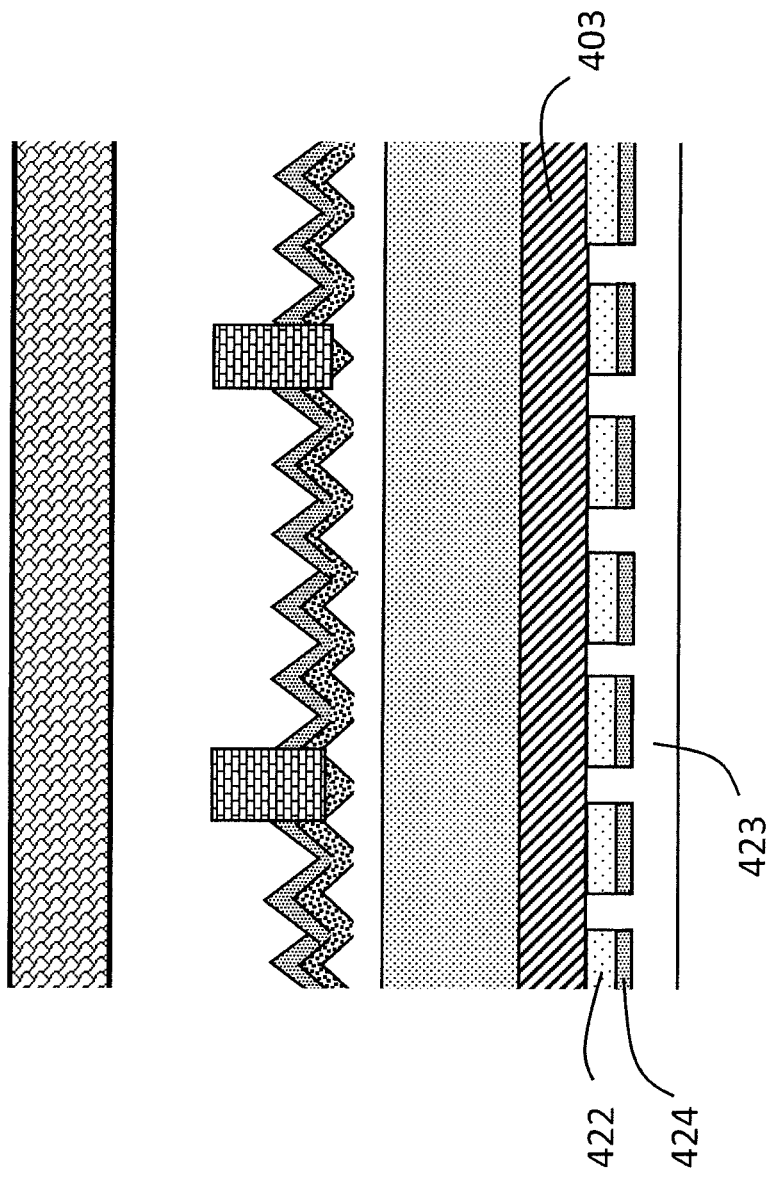

Furthermore, dielectric stacks with multiple layers can be formed to provide improved reflection of IR. For example, the following multiple layers of dielectric can be effective: (1) combinations of amorphous Si and $SiO_2$; and (2) layers of continually decreasing dielectric constant, viz. AlN followed by $SiO_2$. For example, FIG. 18 shows two dielectric layers 422, 424 in the dielectric stack, where dielectric layer 422 and dielectric layer 424 comprise materials specifically chosen such that the combination of layers 422 and 424 improves the IR reflection back into the active layers of the solar cell. Such a dielectric stack with multiple layers may also be utilized in the PERL-e cells.

Figure 19:
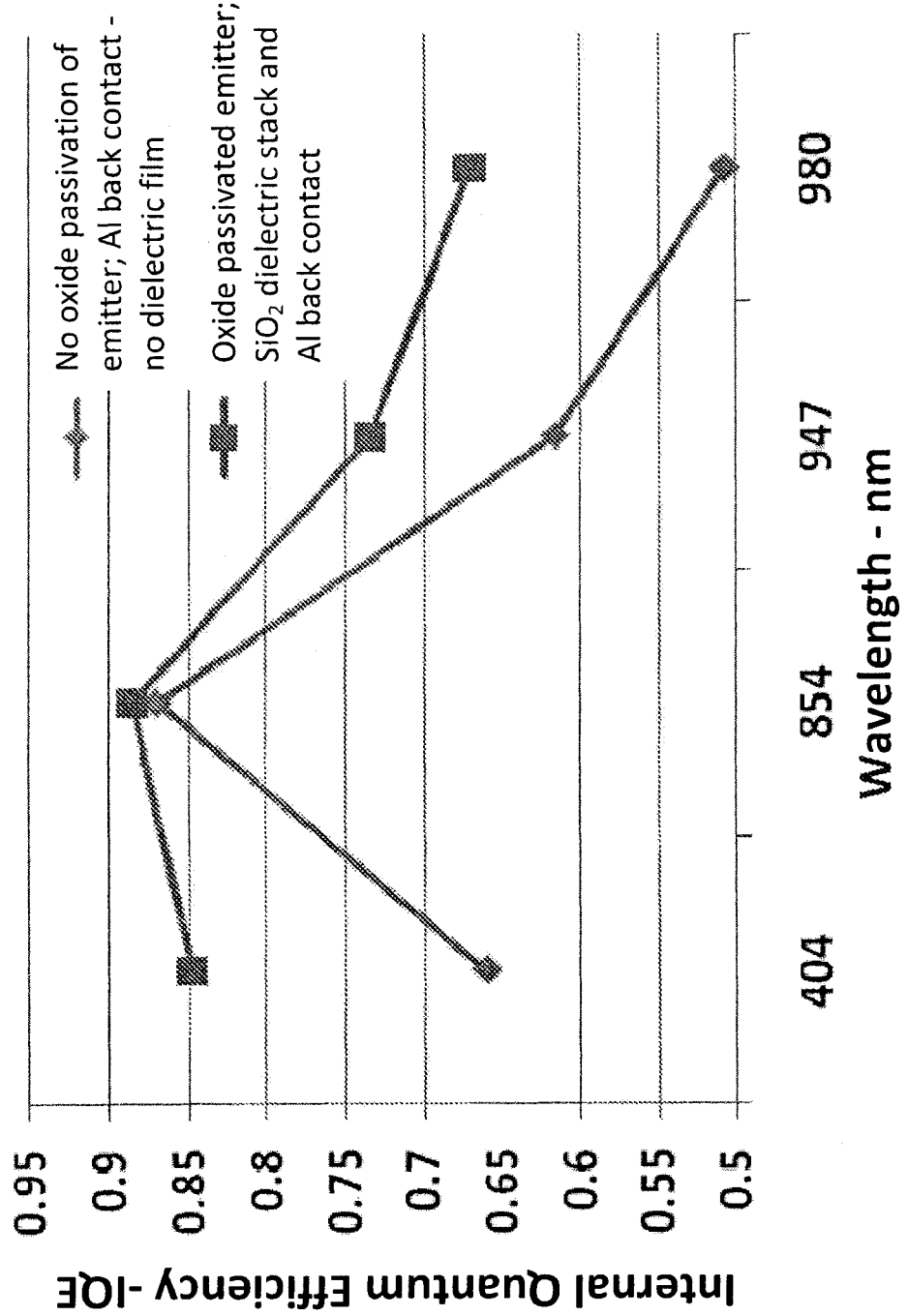
FIG. 19 is a graph of the measured internal quantum efficiency versus wavelength for solar cells with and without the dielectric stack of the present invention.

FIG. 19 shows the spectral response of two solar cells with continuous BSF layers—one with no dielectric stack on the back surface (and no oxide passivation layer on the back surface) and no emitter passivation, and one with a dielectric stack (in this particular example, a layer of silica) and emitter passivation, such as shown in FIG. 17. The device with the dielectric stack was fabricated following the basic process flow of FIGS. 4-7. More specifically, the following significant process details are provided for the device with the dielectric stack: the remnants of the porous silicon on the rear side of the solar cell were removed by a short dip in a silicon etch (KOH or HNO3+HF); a 70 to 90 nm thick layer of $SiO_2$ was deposited by e-beam evaporation; 100 micron holes spaced 1 mm apart were created in the silica layer by lithography; and a 2 micron thick layer of aluminum followed by a flash (approx. 10-20 nm) layer of nickel-vanadium was deposited on the silica to complete the rear dielectric stack fabrication. The passivated emitter shows a significant improvement (approx. 28%) in the IQE at short wavelengths (improved blue response). The dielectric stack at the back results in approx. 32% improvement in the IQE at long wavelengths (improved red response). There is essentially no difference at intermediate wavelengths (approx. 854 nm)—at the intermediate wavelengths light penetrates approx. 20 microns into the silicon and is thus not dominated by the two surfaces and the surface passivation and back dielectric stack have no effect on electrons generated at this depth.

Although the solar cells with dielectric stacks described herein are silicon-based solar cells, the teaching and principles of the present invention are also applicable to solar cells comprising single crystal silicon, multicrystalline silicon, polycrystalline silicon, microcrystalline silicon, nanocrystalline silicon, amorphous silicon, and various compound semiconductors, including cadmium sulphide, cadmium telluride, and CIGS (copper indium gallium selenium) materials.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A method of fabricating a silicon solar cell, said solar cell having front and back surfaces, said solar cell including a base layer of crystalline silicon, said method comprising:
    forming a passivation layer on the back surface of said base layer;
    patterning said passivation layer to form a multiplicity of apertures in said passivation layer corresponding to contact areas on the back surface of said base layer; and
    epitaxially depositing a back surface field structure on said contact areas on the back surface of said base layer;
    wherein said base layer is single crystal silicon, said back surface field structure is continuous over the patterned passivation layer, said back surface field structure is a crystalline silicon structure and the interface between said base layer and said back surface field structure is an epitaxial interface.

2. The method as in claim 1, further comprising depositing a metal layer on the back surface of said back surface field structure.

3. The method as in claim 1, wherein said passivation layer is a layer of thermal silicon oxide.

4. The method as in claim 1, further comprising, after said forming and before said patterning, forming a dielectric layer over said passivation layer, wherein said patterning includes patterning said passivation layer and said dielectric layer to form a multiplicity of apertures in said passivation layer and said dielectric layer corresponding to contact areas on the back surface of said base layer.

5. A method of fabricating a silicon solar cell, said solar cell having front and back surfaces, said solar cell including a base layer of crystalline silicon, said method comprising:
    forming a passivation layer on the back surface of said base layer;
    pattering said passivation layer to form a multiplicity of apertures in said passivation layer corresponding to contact areas on the back surface of said base layer; and
    epitaxially depositing a back surface field structure on said contact areas on the back surface of said base layer;
    wherein said back surface field structure is a continuous and polycrystalline silicon layer and the interface between said silicon base layer and said back surface field structure is an epitaxial interface.

6. The method as in claim 1, wherein said base layer is a silicon wafer.

7. A method of fabricating a silicon solar cell, said solar cell having front and back surfaces, said method comprising:
    providing a back surface field layer and a base layer of crystalline silicon, said back surface field layer being directly on the back surface of said base layer, the interface between said back surface field layer and said base layer being an epitaxial crystalline interface;
    patterning said back surface field layer to form a multiplicity of point contact mesas on the back surface of said base layer;
    depositing a passivation layer over said multiplicity of mesas and the back surface of said base layer; and
    patterning said passivation layer to form a multiplicity of apertures corresponding to said multiplicity of mesas.

8. The method as in claim 7, further comprising depositing a metal layer over said passivation layer and the surfaces of said multiplicity of mesas exposed by said multiplicity of apertures.

9. The method as in claim 7, further comprising, after said depositing and before said patterning said passivation layer, forming a dielectric layer over said passivation layer, wherein said patterning includes patterning said passivation layer and said dielectric layer to form a multiplicity of apertures in said passivation layer and said dielectric layer corresponding to said multiplicity of mesas.

10. The method as in claim 7, wherein said providing includes:
    providing a silicon substrate with a porous silicon separation layer on the surface thereof;
    epitaxially depositing said back surface field layer on said porous silicon separation layer;
    epitaxially depositing said base layer on said back surface field layer; and
    separating said base layer on said back surface field layer from said silicon substrate.

11. The method as in claim 4, wherein said dielectric layer and said passivation layer are formed of different materials, said different materials and the thicknesses of said dielectric layer and said passivation layer being chosen to improve the reflection of infrared light back into the active layers of said solar cell.

12. The method as in claim 1, wherein said contact areas cover less than 1% of the area of the back surface of said base layer.

13. The method as in claim 1, wherein said contact areas are configured in an evenly spaced array.

14. The method as in claim 9, wherein said dielectric layer and said passivation layer are formed of different materials, said different materials and the thicknesses of said dielectric layer and said passivation layer being chosen to improve the reflection of infrared light back into the active layers of said solar cell.

15. The method as in claim 8, wherein said surfaces of said multiplicity of mesas exposed by said multiplicity of apertures cover less than 1% of the area of the back surface of said base layer.

16. The method as in claim 8, wherein said surfaces of said multiplicity of mesas exposed by said multiplicity of apertures are configured in an evenly spaced array.

17. The method as in claim 1, wherein said back surface field structure is a polycrystalline silicon structure.

18. The method as in claim 7, wherein said base layer and said back surface field structure are multicrystalline silicon.

* * * * *